United States Patent [19]
Connors, Jr.

[11] Patent Number: 5,981,002
[45] Date of Patent: Nov. 9, 1999

[54] METHOD FOR DENSIFYING THE EDGES AND SURFACES OF A PREFORM USING A LIQUID PRECURSOR

[75] Inventor: Donald F. Connors, Jr., Nashua, N.H.

[73] Assignee: Textron Systems Corporation, Wilmington, Mass.

[21] Appl. No.: 09/020,523

[22] Filed: Feb. 9, 1998

[51] Int. Cl.[6] .............................. H05B 6/02; B05D 3/02; B32B 9/04
[52] U.S. Cl. ...................... 427/591; 427/226; 427/228; 427/261; 427/282; 427/443.2; 428/446; 428/688
[58] Field of Search .................... 427/226, 228, 427/443.2, 587, 588, 590, 249, 282, 261; 428/446, 688

[56] References Cited

U.S. PATENT DOCUMENTS

| | | | |
|---|---|---|---|
| 3,850,689 | 11/1974 | Basche et al. | 117/229 |
| 4,212,906 | 7/1980 | Fisher et al. | 427/237 |
| 4,472,454 | 9/1984 | Houdayer et al. | 427/45.1 |
| 4,580,524 | 4/1986 | Lackey et al. | 118/725 |
| 4,806,388 | 2/1989 | Mochizuki et al. | 427/46 |
| 5,348,774 | 9/1994 | Golecki et al. | 427/543 |
| 5,389,152 | 2/1995 | Thurston et al. | 118/429 |
| 5,397,595 | 3/1995 | Carroll et al. | 427/228 |
| 5,547,717 | 8/1996 | Scaringella et al | 427/590 |
| 5,686,144 | 11/1997 | Thebault et al. | 427/282 |

FOREIGN PATENT DOCUMENTS

| | | |
|---|---|---|
| 0081409A1 | 6/1983 | European Pat. Off. . |
| 0515186A2 | 11/1992 | European Pat. Off. . |
| 0592239A2 | 4/1994 | European Pat. Off. . |
| 98/00575 | 1/1998 | WIPO . |

*Primary Examiner*—Janyce Bell
*Attorney, Agent, or Firm*—Hamilton, Brook, Smith & Reynolds, P.C.

[57] ABSTRACT

The invention includes a method for densifying one or more porous preforms, including the edges and surfaces of one or more preform, when using a liquid precursor. The method includes covering at least a portion of the porous preform with an insulating material to insulate at least a part of the preform. The preform is submerged in a precursor liquid which is heat-decomposable. The preform is heated in the precursor liquid at a temperature sufficient to decompose the precursor liquid within the preform and to deposit a decomposition product of the precursor liquid within the preform. The heating of the preform is continued in the precursor liquid until at least part of the insulated portion of the preform, which would not densify in this process without insulation, is densified.

20 Claims, 3 Drawing Sheets

METHOD FOR DENSIFYING THE EDGES AND SURFACES OF A PREFORM USING A LIQUID PRECURSOR

BACKGROUND OF THE INVENTION

Presently, high performance brake disks for aircraft are frequently made by densifying carbon preforms through chemical vapor deposition using a gaseous methane precursor to form a carbon/carbon composite. This densification process typically involves repeated cycles consisting of densification followed by machining of the preform surface to open pores closed during densification. One disadvantage of this technique is that it can require large amounts of time, sometimes on the order of hundreds of hours to fully densify the preform.

Alternatively, the densification must be performed slowly so that the pores on the outside of the preform do not get filled before the pores on the inside of the preform. Were the pores on the outside of the preform to be blocked before densification of the interior portions, insufficient precursor would reach the inner portions of the preform and it would not be fully densified.

One approach to avoid this problem is by using a liquid hydrocarbon precursor densification process, such as is disclosed in U.S. Pat. No. 5,389,152, issued on Feb. 14, 1995 to Thurston et al. In this process, overall densification occurs from the inside of the preform outward. Densification can, thus, be performed at a higher rate without concern that the pores at the exterior of the preform will be blocked and prevent densification of the preform interior.

During densification with a liquid precursor, the temperature gradient is such that the center of the preform is hotter than the surface and thus the densification proceeds from the center to portions of the surface as the temperature of the preform is increased. Typically, portions of the preform near some of the surfaces do not densify using this process. As a result, portions of the edges of the preform are often machined away after densification using a liquid precursor to form a fully densified structure. However, this process increases the waste associated with densification.

Therefore, a need exists for an improved method that allows densification of the regions of a preform that do not normally densify when using a liquid precursor.

SUMMARY OF THE INVENTION

The invention includes a method for the densifying one or more porous preforms, including the edges and surfaces of one or more preform, when using a liquid precursor.

The method includes covering at least a portion of the porous preform with an insulating material to insulate at least a part of the preform. The preform is submerged in a precursor liquid which is heat-decomposable. The preform is heated in the precursor liquid at a temperature sufficient to decompose the precursor liquid within the preform and to deposit a decomposition product of the precursor liquid within the preform. The heating of the preform is continued in the precursor liquid until at least part of the insulated portion of the preform, which would not densify in this process without the insulation, is densified.

DETAILED DESCRIPTION OF THE INVENTION

The features and details of the method and apparatus of the invention will now be more particularly described with reference to the accompanying drawings and pointed out in the claims. It will be understood that the particular embodiments of the invention are shown by way of illustration and not as limitations of the invention. The principal features of this invention can be employed in various embodiments without departing from the scope of the invention.

Figure 1:
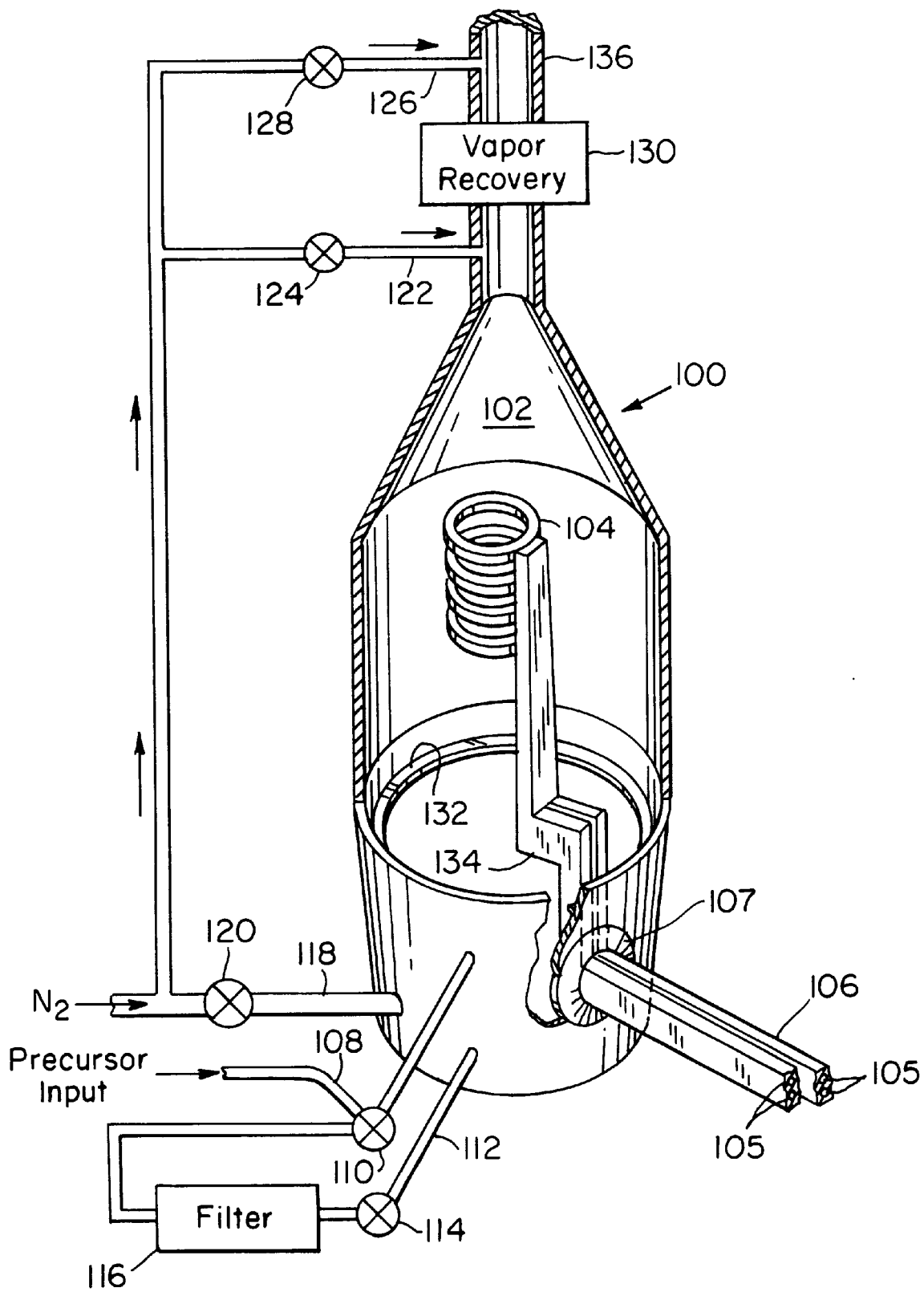
FIG. 1 is a schematic drawing of a reactor for densifying preforms.

FIG. 1 shows reactor 100 suitable for performing densification according to the method described in U.S. Pat. No. 5,389,152, issued to Thurston et al. on Feb. 14, 1995, the teachings of which are incorporated herein by reference, and according to the method in U.S. Pat. No. 4,472,454, issued to Houdayer et al. on Sep. 18, 1984, the teachings of which are also incorporated herein by reference. Reactor 100 is described in U.S. Pat. No. 5,397,595, issued to Carroll et al. on Mar. 14, 1995 and in U.S. Pat. No. 5,547,717, issued to Scaringella et al. on Aug. 20, 1996. The teachings of both are additionally incorporated herein by reference. When an induction coil, such as induction coil 104, is used to heat a preform, reactor 100 is preferably made from non-magnetic materials, such as aluminum, quartz, glass, stainless steel, ceramic or combinations thereof.

Reactor 100 contains cavity 102 in which one or more preforms (not shown) are densified. In operation, cavity 102 is filled with a precursor liquid sufficient to at least cover the preform. The precursor liquid is a liquid which vaporizes and decomposes within the preform to deposit a decomposition product of the precursor at a temperature to which the preform can be heated. Depending upon the precursor liquid, the decomposition product can be carbon, silicon carbide, silicon nitride, or another decomposition product. The precursor liquid should also be a dielectric. Preferably, the dielectric constant of the precursor liquid should be above 0.5, more preferably above one, and most preferably above 1.5. To deposit carbon within the preform, a hydrocarbon with an appropriate boiling point, such as cyclohexane, n-hexane or benzene can be used. Methyltrichlorosilane, dimethyldichlorosilane, methyldichlorosilane or other organosilane or organosilane mixtures can be used for depositing silicon carbide. Also, the precursor liquid can be chosen to co-deposit materials. For example, a mixture of silicon carbide and silicon nitride can be deposited using tris-n-methyl amino silane or other silane compound.

One or more induction coils 104 are positioned within cavity 102. In operation, induction coil 104 is covered by the precursor liquid and operates to heat the preform. Induction coil 104 can be formed is made from copper or other highly conductive material which does not react with the precursor liquid even if heated.

Electrical energy is provided to induction coil 104 through busses 106. Busses 106 are made of a highly conductive material, such as copper. Currents of hundreds of amperes to thousands of amperes are preferably used to provide sufficient power to heat the preform. Because of the large amount of current, busses 106 should have sufficient cross sections to avoid excess heating. Busses 106 can contain water passages 105 to carry cooling water through busses 106 and through induction coil 104.

Busses 106 are connected to a power supply (not shown). An AC supply is used. The voltage, current, frequency and shape of induction coil 104 are determined by the shape, geometry and the electrical properties of the preform using known techniques. Typically, the initial power is at a level that inductively heats the preform to generate a temperature in the center of the preform that is high enough to decompose the precursor and form a decomposition product within the preform, but low enough such that undensified areas of the preform are not sealed off by deposition of the decomposition product external to these areas, thereby resulting in non-uniform densification. At the densification center, which is not necessarily, but is typically, at the center of the preform, the temperature is typically in the range of between about 850° and 2,000° C. The preferred temperature is in the range of between about 850° and 1,000° C.

Busses 106 pass through seal 107 to enter chamber 102. As chamber 102 contains a precursor liquid during operation, seal 107 must be resilient and also resistant to chemical attack by the precursor liquid. Seal 107 should also electrically insulate busses 106 from reactor 100 in the event reactor 100 is formed from conducting components. For example, silicone rubber can be used to seal the opening in reactor 100 through which busses 106 pass.

As a matter of convenience, busses 106 enter the lower portion of reactor 100. If busses 106 enter the upper position of reactor chamber 102, seal 107 is still needed. It does not have to prevent the escape of liquid, but it does have to prevent the escape of vapor from chamber 102. Busses 106 can enter chamber 102 through stack 136, in which case no special seal is needed. However, it is desirable to keep busses 106 as short as possible to reduce power loss in the busses.

Precursor liquid is supplied to reactor 100 through precursor input 108 via valve 110. Initially, chamber 102 is filled with a precursor liquid of sufficient quantity to cover the preform. In operation, the precursor liquid can be consumed in the deposition reaction or escape from reactor 100 as vapor. Accordingly, precursor input 108 can be utilized during operation of reactor 100 to replace precursor liquid which is dissipated.

During densification, the liquid precursor can become clouded. Accordingly, valve 114 can be opened to allow precursor liquid to flow through reactor 100 and return 112 to filter 116 where it is filtered and pumped back into reactor 100. Filter 116 can be any suitable filter, such as a porous ceramic screen or, more preferably, charcoal. Preferably, the precursor liquid can be removed from reactor 100 and can instead be distilled after one or more densification cycles once the precursor liquid becomes cloudy.

The precursor liquids, as used herein, are potentially flammable. Accordingly, it is preferable that the densification operation be performed in an inert atmosphere. For example, nitrogen gas can be used. To purge chamber 102 of air, valve 120 is opened to allow an inert gas, such as nitrogen, to flow through input 118. Valve 124 can be opened to more rapidly and effectively purge vapor recovery system 130. Once the atmosphere in chamber 102 is replaced by an inert gas, such as nitrogen, valve 128 can be opened to provide nitrogen directly into vent stack 136. This flow of nitrogen prevents air from reaching chamber 102 and valves 120 and 124 can be closed. Closing valves 120 and 124 reduces the flow of gas through vapor recovery system 130. Vapor recovery system 130 can therefore operate more efficiently.

Vapor recovery system 130 is a system of the type known in the art for recovering vaporized liquids. Such a system reduces the amount of waste generated in the process and the amount of precursor used. Further, vapor recovery system 130 is for preventing the loss of a significant volume of the precursor liquid from vaporization.

In operation, a preform is placed in chamber 102 in close proximity to induction coil 104. A preform includes a fibrous structure, either woven or non-woven, having through pores. The fibers need to be essentially chemically non-reactive during the process of densification and under the conditions of their intended use. The preform is preferably placed in a support fixture to firmly hold the preform at a constant position in relation to the reactor and coil. The exact shape of the fixture is based on the shape of the preform. Such a fixture can be supported in any convenient way, such as on lip 132. It can be desirable to use different sizes or shapes of coils based on the shape of the preform. For this reason, induction coil 104 is connected to busses 106 at connector 134. Connector 134 continues the electrical circuit comprising busses 106. It also continues the water flow circuit formed by channels 105. Connector 134 can be a block of metal allowing anchoring points for screws (not shown) to hold the base of induction coil 104 to busses 106. The joints in the water flow circuit can be sealed by flexible "O" rings or in some other convenient fashion. The material must be resistant to degradation in both water and the precursor liquid. Viton® fluoroelastomer from E. I. DuPont de Nemours & Co. or silicone rubber can be used for this purpose. Other attachment arrangements, such as slots and grooves or clips, can also be used.

Figure 2:
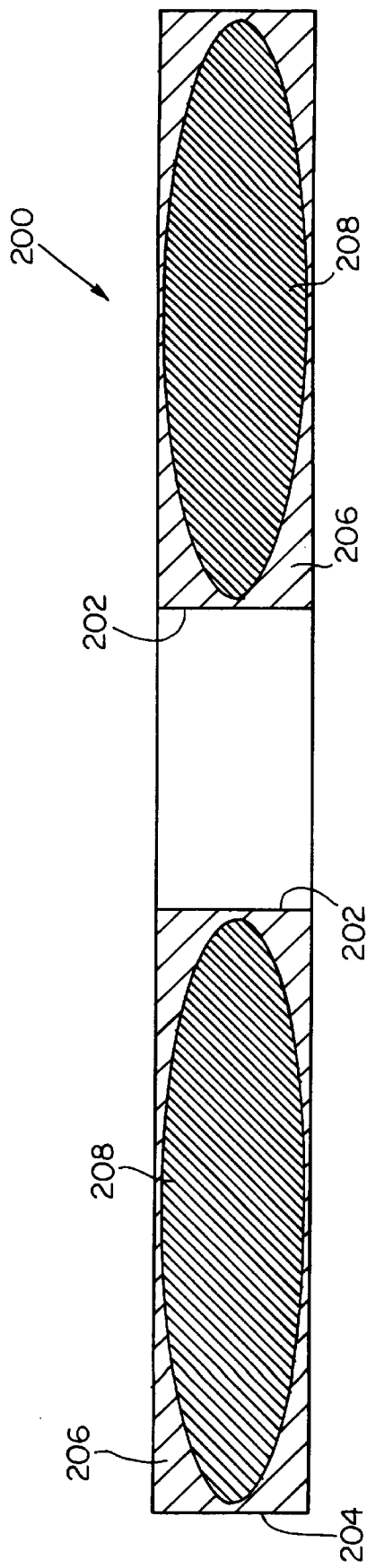
FIG. 2 is a cross-sectional view of a brake disk preform densified in an apparatus as shown in FIG. 1 and a process described in Example 1.

Densification of the preform takes advantage of a boiling precursor liquid to establish a temperature gradient within a heated preform. The temperature gradient is such that the densification center of the preform is hotter than the surface and thus the densification proceeds from the center to the surface as the temperature of the preform is increased. As deposition of the decomposition product proceeds, the conductivity of the preform increases, improving the coupling with the electric field. As shown in FIG. 2, the inside diameter surfaces 202 and outer diameter surfaces 204 of preform 200 do not densify completely due to the large heat loss at these locations leaving undensified portion 206 and densified portion 208. Typically, it would be necessary to machine away undensified portion 206 of preform 200.

During densification with a liquid precursor, the temperature gradient is such that the center of the preform is hotter than the surfaces and thus the densification proceeds from the center to the surfaces as the temperature of the preform is increased. During prior known liquid densification methods, the densification is reduced in peripheral regions of the preform, because the precursor liquid cools the edges and surfaces of the preform resulting in a reduced densification in some regions of the preform. Often the densified region is oval in shape as shown in FIG. 2.

Figure 3:
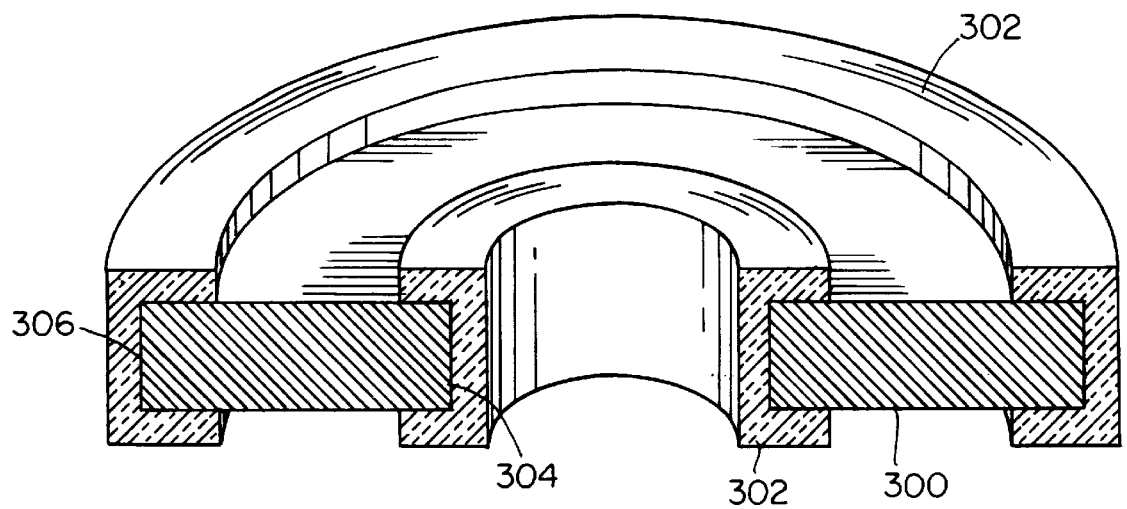
FIG. 3 is a perspective view of a second brake disk preform with an insulating material, such as a low density carbon felt.

To increase the densification of the preforms at the regions that would not normally be densified when using a liquid precursor, the heat lost to the precursor liquid at these locations must be reduced. Densification at these regions including surfaces and the edges of the preform can be improved by insulating surfaces of the preform, such as the inside diameter, outside diameter, top and bottom surfaces with an insulating material. The insulating material, such as a carbon felt, does not significantly interfere with the heating of the preform while minimizing heat loss to the liquid and maintaining a higher temperature at the edges and surfaces of the preform. The densification with the decomposition product can be tailored, as desired, by insulating selected surfaces and regions of the preform with insulating material. Such a selective deposition tailoring by strategic placement of insulating material can result in preforms with tailor shaped densification regions. The insulating material must be a material that is capable of surviving in the densification environment and does not interfere with the heating of the preform. It must be able to withstand temperatures in excess of about 1,000° C., be inert to the precursor liquid and does not significantly couple inductively. Examples of suitable insulating materials include carbon felts and ceramics. The insulating material may be either reusable or non-reusable. Preferably, the insulating material is attached, such as by stitching or by other appropriate means, to at least one edge of the preform, more preferably to the inside diameter and outside diameter edges and surfaces of a preform, as is shown in FIG. 3. An example of such a felt is carbon felt, which is available from Material Unlimited, Somerville, Mass. In one embodiment, typically carbon felt can have a thickness in the range of between about 0.1 inches and one inch or more.

In FIG. 3, the preform 300 is processed using a modified heating cycle in which the final power is decreased by about twenty-five percent from the power necessary to densify to the outer surfaces of the reform. By adding insulating material 302, such as felt, to the inside diameter surface 304 and outside diameter surface 306 of a non-woven preform prior to processing, the densification profile from the inside diameter and outside diameter surfaces can be optimized, which can result in less power consumed during processing and can lead to a shorter cycle time.

In an alternate embodiment, wherein the preform is partially densified, densification within the preform can also be tailored, as desired by insulating selected surfaces and regions of the preform with insulating material. To partially densify a preform, densification is terminated at a distance, which is typically predetermined, from the outer surface of the preform. Typically, but not always, the distance is between about 0.1 and 0.2 inches (2.5 and 5.0 mm) from the wear surface. The desired degree of densification can be obtained by reducing power, thereby reducing temperature in the preform for the last twenty-five percent of a full densification cycle. Such partial densification processes are further described in U.S. patent application Ser. No. 09/020,432, filed Feb. 9, 1998, the teachings of which are incorporated by reference herein.

Figure 4:
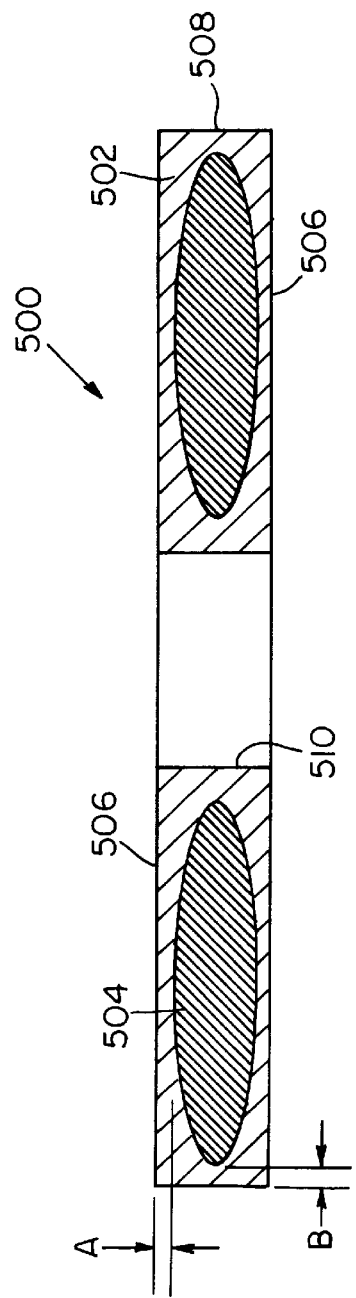
FIG. 4 is a cross-sectional view of a third brake disk preform that is partially densified as described in Example 2.
Figure 5:
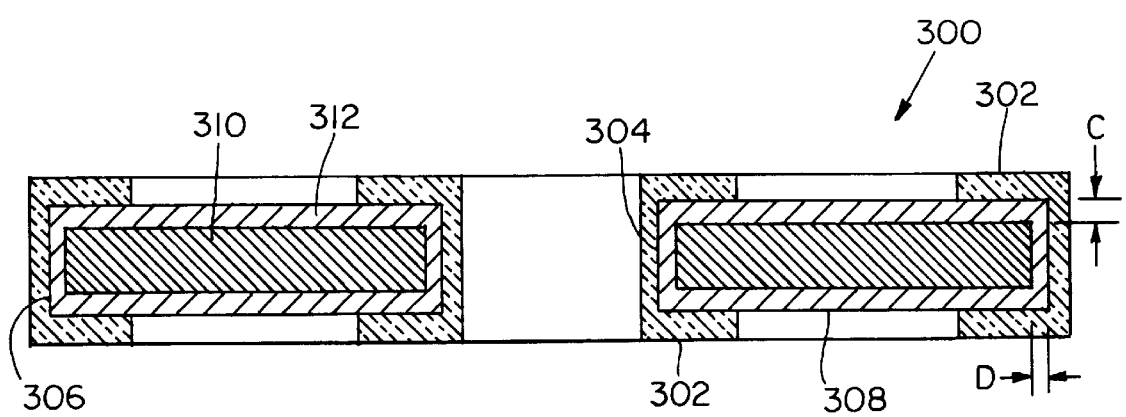
FIG. 5 is a cross-sectional view of a fourth brake disk preform that is partially densified while partially covered with insulating material and as described in Example 3.

For example, FIG. 4, as further described in Example 2, shows a disk that was partially densified without the use of insulation. By contrast, the effects of the use of insulation to tailor densification within a partially densified disk are shown in FIG. 5, as further described in Example 3. In further contrast, FIG. 2, as described in Example 1, shows a preform in which full densification was attempted using a precursor liquid without using insulation.

EXAMPLE 1

A non-woven preform was constructed by stacking up layers of oxidized carbon tow (Avox carbon tow available from Textron Systems Corporation) and poking barbed needles through the stack. The needles dragged fibers through the layers locking the layers together. The preform was then subjected to a high temperature heat treatment (1,800° C.) under vacuum to convert the oxidized fiber to carbon fiber (Avcarb). After heat treatment, the preform had a weight of 1,705 grams, a density of 0.54 g/cm$^3$ and a fiber volume of 31 percent. A non-woven carbon preform for a disk brake was formed from the material having an inside diameter of five inches, an outside diameter of 13.5 inches and a thickness of 1.56 inches. The preform was densified in a reactor similar to the one shown in FIG. 1 with cyclohexane as the precursor liquid.

The reactor included a liquid tight vessel capable of holding cyclohexane, a vapor recovery system to reclaim the vaporized cyclohexane, an inductive power supply and an induction coil capable of coupling to and heating a carbon preform. The vapor recovery system included a plate heat exchanger, Alfa Laval model type M10-BWFG. The inductive power supply included a Lepel LSP12-200-30 Model having a power of 200 kW and a frequency of 30 kHz.

The preform was placed within the reactor vessel and fixtured within the center of a pair of pancake induction coils. The reactor vessel was then assembled and attached to the vapor recovery system (plate heat exchanger). Cyclohexane was pumped into the reactor vessel submerging the preform and induction coils in liquid cyclohexane. The reactor system was then purged with nitrogen gas for a minimum of twenty minutes to remove any air present within the system.

The preform was then heated using the induction power supply system. The output power of the power supply was manually controlled by an operator. The operator maintained the output power of the power supply to follow a predetermined power trajectory.

Upon completion of the densification cycle, the reactor was drained of cyclohexane and disassembled. The preform was removed from the set-up and placed in a solvent proof oven and dried at 175° C. for a minimum of four hours to remove any residual cyclohexane. Over a five hour densification cycle, the power density was set at 85 W/in$^2$ and then the power density was increased to about 350 W/in$^2$ at 300 minutes. The power density for the run with cyclohexane is shown in Table I.

The preform after being dried, as in all of the following Examples, was cut in half using a band saw with a diamond blade. The exposed surfaces were then hand polished using fine grit emery paper. These surfaces were then viewed under low magnification (5–10x) and the deposition profile was measured using a six inch vernier caliper.

TABLE I

| cycle time (min) t | power density (W/in$^2$) Pd(t) |
|---|---|
| 0 | 85 |
| 20 | 85 |
| 40 | 85 |
| 60 | 85 |
| 80 | 85.5 |
| 100 | 86 |
| 120 | 87.5 |
| 140 | 91 |
| 160 | 96.5 |
| 180 | 105.5 |
| 200 | 120 |
| 220 | 141 |
| 240 | 172 |
| 260 | 214.5 |
| 280 | 272.5 |
| 300 | 350 |

The densified preform resulted in a high deposition at the surface of preform, as shown in FIG. 2. Densification of a portion of the surface of the disk was visible. This indicated the need to reduce the power density at the end of the cycle.

EXAMPLE 2

A non-woven carbon preform was formed by the same method as described in Example 1. The non-woven carbon

TABLE II

| cycle time (min) t | power density (W/in$^2$) Pd(t) |
|---|---|
| 0 | 85 |
| 20 | 85 |
| 40 | 85 |
| 60 | 85 |
| 80 | 85.5 |
| 100 | 86 |
| 120 | 87 |
| 140 | 90 |
| 160 | 94.5 |
| 180 | 101.5 |
| 200 | 113.5 |
| 220 | 130.5 |
| 240 | 155.5 |
| 260 | 190 |
| 280 | 237.5 |
| 300 | 300 | preform for a brake disk was formed having an inside diameter of five inches, an outside diameter of 13.5 inches and a thickness of 1.59 inches. The preform had a weight of 1,680 grams, a density of 0.522 g/cm$^3$ and a fiber volume of 30 percent. The power density for this run was reduced as compared to the run in Example 1. Over a five hour densification cycle, the power density was set at 85 W/in$^2$ and then the power density was increased to about 300 W/in$^2$ at 300 minutes. The power density for the run with cyclohexane is shown in Table II.

A cross-sectional view of the partially densified preform is shown in FIG. 4. The partially densified preform 500 resulted in an undensified portion 502 and a densified portion 504 at a desired distance from the faces. The densification stopped at a distance of about 0.11 to 0.13 inches (Distance A as shown in FIG. 4) from the side surfaces 506 and at a distance of about 0.35 inches (Distance B as shown in FIG. 4) from the outside diameter 508 and inside diameter 510.

EXAMPLE 3

A non-woven carbon preform was formed by the same method as described in Example 1. The non-woven carbon preform for a brake disk was formed having an inside diameter of five inches, an outside diameter of 13.5 inches and a thickness of 1.59 inches. The preform had a weight of 1,690 grams, a density of 0.53 g/cm$^3$ and a fiber volume of thirty percent. The preform was covered with carbon felt having a thickness of 0.3 inches over the outside diameter surface and inside diameter and extending 0.75 inches from the edges and surfaces over the faces. The insulating felt was stitched onto the preform. The power density for a run with cyclohexane was the same as described in Example 2.

As shown in FIG. 5, the disk brake preform 300 is partially densified to form densified portion 310 and undensified portion 312 while partially covered with insulating material 302. This allows formation of a more uniform densification profile from the surfaces of the inside diameter and outside diameter of the preform. In this embodiment, the shape is more rectangular than oval in shape, as shown previously in FIG. 2.

The densified preform was produced with a densified portion 310 that stopped at a distance of about 0.12 inches (Distance C as shown in FIG. 5) from the wear surfaces 308 and at a distance of about 0.11 to 0.13 inches (Distance D as shown in FIG. 5) from the outside diameter and inside diameter. The bands of carbon felt added to the outside diameter and inside diameter surfaces of the preform prior to the processing resulted in a selective tailoring of the densification profile that was nearer to the outside diameter and inside diameter and was more uniform than the densified preform of Example 2.

EQUIVALENTS

Those skilled in the art will recognize or be able to ascertain using no more than routine experimentation, many equivalents to the specific embodiments of the invention described specifically herein. Such equivalents are intended to be encompassed in the scope of the claims.

I claim:

1. A method for densifying one or more porous preforms, comprising:
    a) covering at least a portion of the porous preform with an insulating material to insulate at least a part of said preform;
    b) submerging the preform in a precursor liquid which is heat-decomposable;
    c) heating the preform in the precursor liquid at a temperature sufficient to decompose the precursor liquid within the preform and to deposit a decomposition product of the precursor liquid within the preform; and
    d) continuing heating said preform in the precursor liquid until said preform including said portion is densified with said decomposition product.

2. The method of claim 1 further including the step of removing the insulating material from the densified preform.

3. The method of claim 1 wherein the decomposition product includes carbon.

4. The method of claim 1 wherein the precursor liquid includes a hydrocarbon.

5. The method of claim 4 wherein the hydrocarbon is selected from the group consisting of cyclopentane, cyclohexene, 1-hexene, gasoline, toluene, methylcyclohexane, cyclohexane, n-hexane and benzene, or a combination thereof.

6. The method of claim 1 wherein the porous preform in the precursor liquid is heated by an induction coil.

7. The method of claim 1 wherein the decomposition product includes silicon carbide.

8. The method of claim 1 wherein the precursor liquid includes an organosilane.

9. The method of claim 8 wherein the organosilane is selected from the group consisting of methyltrichlorosilane, dimethyldichlorosilane and methyldichlorosilane.

10. The method of claim 1 wherein the insulating material includes a carbon felt.

11. The method of claim 1 wherein the insulating material includes a ceramic.

12. A densified preform formed by the method of claim 1.

13. A brake assembly having a densified preform formed by the method of claim 1.

14. A method for densifying one or more porous preforms, comprising:
    a) covering with a low density carbon felt at least a portion of the porous preform to insulate at least a part of said preform;

b) submerging the preform in cyclohexane;

c) heating the preform in the cyclohexane to a temperature sufficient to decompose the cyclohexane within the preform; and d) continuing heating said preform in the cyclohexane until said preform including said portion is densified with carbon, thereby densifying the porous preform.

15. A densified preform formed by the method of claim 14.

16. A method for the partial densification of one or more porous preforms, comprising:

a) covering the porous preform with an insulating material that covers at least a portion of the preform to insulate at least a part of said preform;

b) submerging the preform in a precursor liquid which is heat-decomposable;

c) heating the preform in the precursor liquid at a temperature sufficient to decompose the precursor liquid and to deposit a decomposition product of the precursor liquid within the preform; and d) continuing heating said preform in the precursor liquid until said preform including said portion is densified with said decomposition product to a distance from the surface of a portion of the preform.

17. The method of claim 16 wherein the decomposition product includes carbon.

18. The method of claim 16 wherein the precursor liquid includes a hydrocarbon.

19. The method of claim 16 wherein the insulating material includes a carbon felt.

20. A method for at least partially densifying one or more porous preforms with a tailored densification, comprising:

a) covering at least a portion of the porous preform by insulating a selected region of the preform with insulating material for the tailored densification;

b) submerging the preform in a precursor liquid which is heat-decomposable;

c) heating the preform in the precursor liquid at a temperature sufficient to decompose the precursor liquid within the preform including within said insulated region; and d) continuing heating said preform in the precursor liquid until said selected region within said preform is at least partially densified with said decomposition product, thereby at least partially densifying the preform with the tailored densification.

* * * * *